(12) United States Patent
Holm

(10) Patent No.: US 6,301,264 B1
(45) Date of Patent: Oct. 9, 2001

(54) ASYNCHRONOUS DATA CONVERSION CIRCUIT

(75) Inventor: Jeffrey J. Holm, Edina, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/089,006

(22) Filed: Jun. 2, 1998

(51) Int. Cl.[7] ................................. H03M 7/20; H04J 3/12
(52) U.S. Cl. ............................ 370/465; 710/52; 341/103
(58) Field of Search .................................. 341/52, 53, 55, 341/67, 95, 102, 103, 58; 370/392, 394, 465, 466, 522, 535; 710/52, 53

(56) References Cited

U.S. PATENT DOCUMENTS

| | | | |
|---|---|---|---|
| 4,847,750 | 7/1989 | Daniel | 395/842 |
| 4,855,742 | * 8/1989 | Verboom | 341/103 |
| 5,163,136 | 11/1992 | Richmond | 395/850 |
| 5,414,813 | 5/1995 | Shiobara | 395/200.75 |
| 5,542,110 | 7/1996 | Minagawa | 395/845 |
| 5,619,497 | * 4/1997 | Gallagher et al. | 370/394 |
| 5,691,977 | * 11/1997 | Yoshimura et al. | 370/392 |
| 5,717,952 | 2/1998 | Christiansen et al. | 395/842 |
| 6,044,088 | * 3/2000 | Rahman et al. | 370/465 |
| 6,054,942 | * 4/2000 | Stemmler | 341/58 |
| 6,105,086 | * 4/2000 | Doolittle et al. | 710/53 |

OTHER PUBLICATIONS

"MU95C5480 LANCAM," *Music Semiconductors*, Rev. 0, pp.1–12. (Jul. 22, 1994).

"Information technology—Telecommunications and information exchange between systems—High–level data link control (HDLC) procedures—Elements of procedures," *ISO/IEC 4335*, Fifth edition. (Dec. 15, 1993).

"Information technology—Telecommunications and information exchange between systems—High–level data link control (HDLC) procedures—Frame structure," *ISO/IEC 3309*, Fifth edition, (Dec. 15, 1993).

W. Simpson, Editior, Daydreamer, "PPP in HDLC–like Framing," pp. 1–25, (last modified Jul. 1994) <ftp://ds.internic.net/rfc>.

\* cited by examiner

*Primary Examiner*—Alpus H. Hsu
*Assistant Examiner*—Afsar M. Qureshi

(57) ABSTRACT

A data conversion circuit and method are disclosed for converting an N-bit data stream to an M-bit data stream. A FIFO memory device having multiple N-bit memory locations receives as an input consecutive N-bit sets of data and stores each consecutively received N-bit set of data in consecutive memory locations. A write pointer identifies a next available memory location at which the next N-bit set of data is to be stored. A first read pointer identifies a first memory location containing a first portion of a first M-bit set of data. A second read pointer identifies a second memory location containing a last portion of the first M-bit set of data. Provided as the first M-bit set of data are each of the N-bit memory locations between and including the memory location identified by the first read pointer and the memory location identified by the second read pointer.

19 Claims, 3 Drawing Sheets

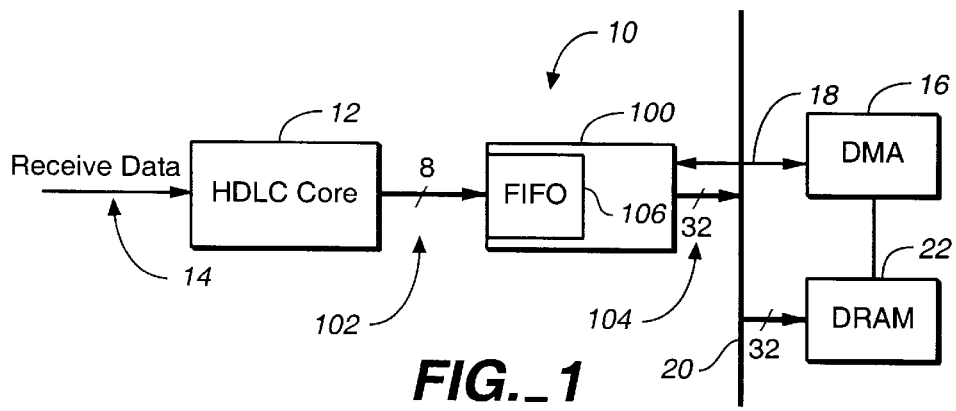
FIG._1
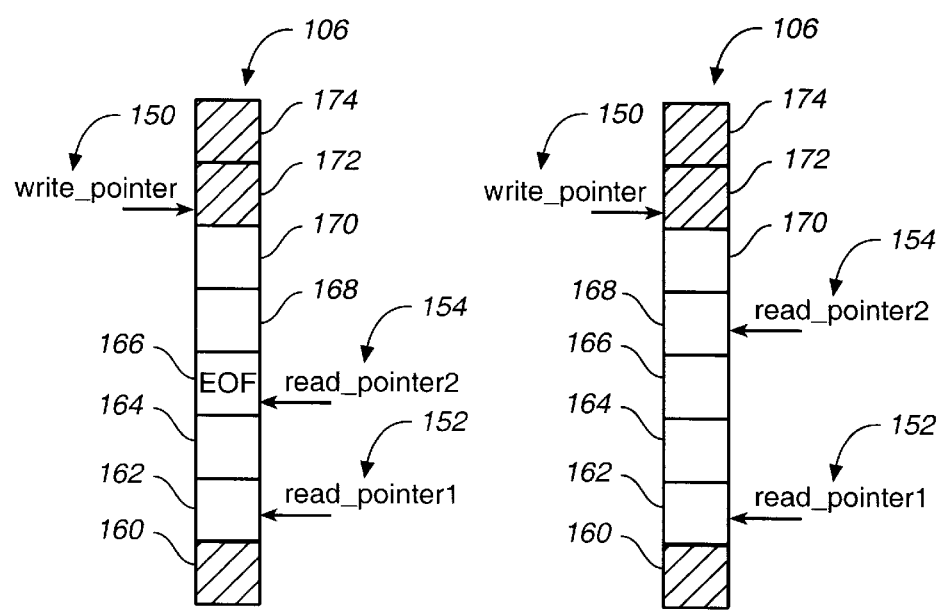
FIG._3     FIG._4

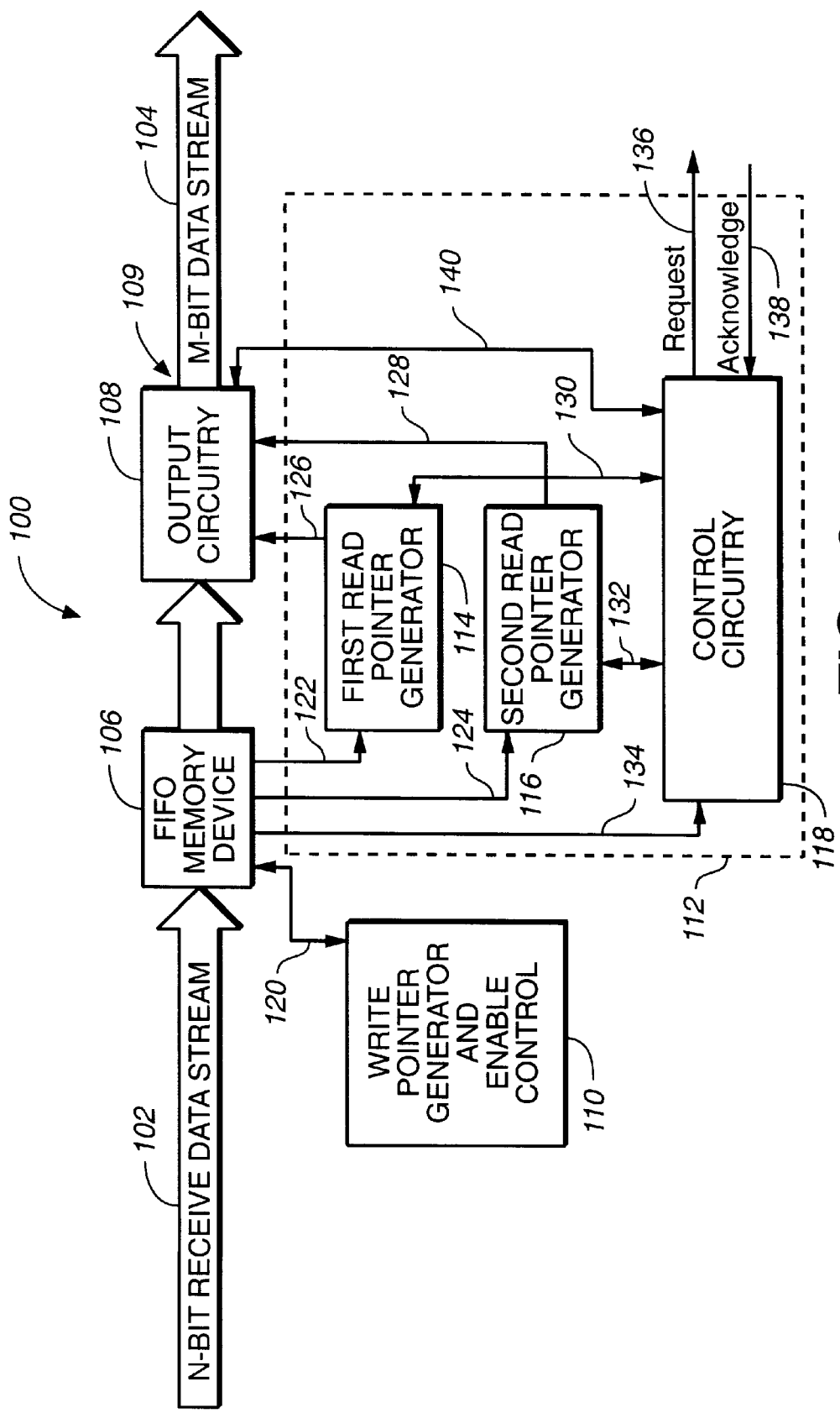
FIG._2

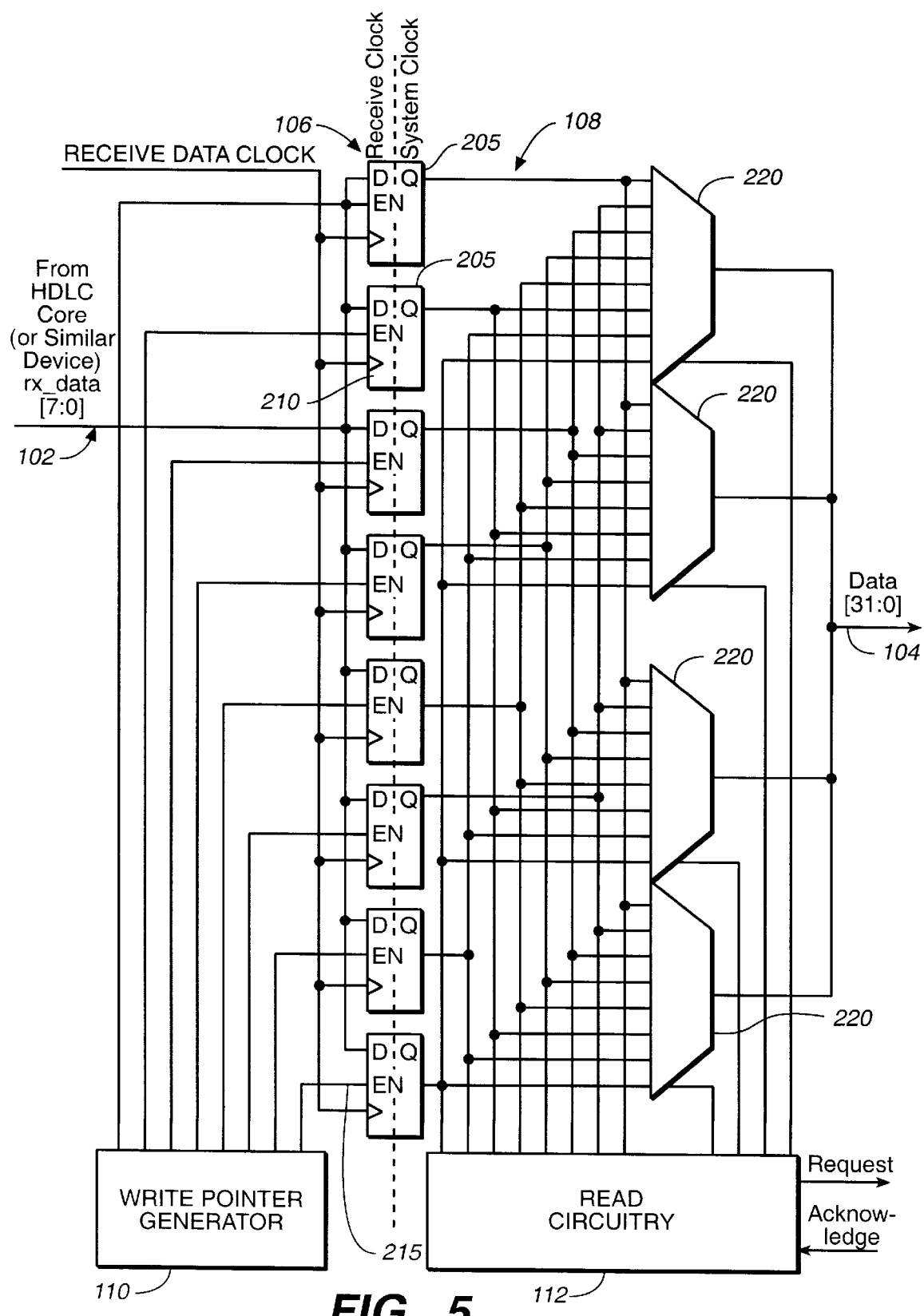
FIG._5

ASYNCHRONOUS DATA CONVERSION CIRCUIT

BACKGROUND OF THE INVENTION

The present invention relates generally to data conversion circuits for converting a data stream having a first width into a data stream having a second width. More particularly, the present invention relates to a data conversion circuit for converting an N-bit data stream received at a first clock rate into an M-bit data stream having a second clock rate, which provides end of frame detection and which minimizes a potential for loss of data.

In telecommunications, it is often the case that a data stream having a first width (for example a byte data stream) needs to be converted to a data stream having a second width (for example a word data stream). An example is a High Level Data Link Control (HDLC) core which receives data one byte (an 8-bit set of data) at a time. Eventually, the data needs to be put into random access memory (RAM), for example by a direct memory access (DMA) device, which is likely to have a word (32-bit) or wider interface. Additionally, the HDLC data is on a different clock domain than the rest of the system. In this type of situation, it is also necessary to insure that two frames of data are not placed in the same word. Therefore, when an end of frame is detected, the remainder of the word must be padded so that the first byte of each frame starts on a fresh word.

Some conventional methods of converting data from a data stream having a first width to a data stream having a second width include a receiving device which receives data until an end of frame (EOF) designation is detected. Upon detection of the EOF designation, received data is automatically shifted from the receiving device. Conventional data conversion circuits of this type can suffer the following disadvantages. First, using these conventional data stream conversion circuits, if multiple one-byte frames occur back to back, the circuit only has one byte-time to retrieve the data to prevent data loss. In a communication system with several channels, each arbitrating for access to the system bus, one byte-time may not be enough and the data can be lost before it is retrieved by the system. Second, it is often the case that the receive clock stops at the end of a frame. If the receive clock stops before the data is shifted, the end of frame data can be lost.

SUMMARY OF THE INVENTION

A data conversion circuit and method are disclosed for converting an N-bit data stream to an M-bit data stream. A FIFO memory device having multiple N-bit memory locations receives as an input consecutive N-bit sets of data and stores each consecutively received N-bit set of data in consecutive memory locations. A write pointer identifies a next available memory location at which the next N-bit set of data is to be stored. A first read pointer identifies a first memory location containing a first portion of a first M-bit set of data. A second read pointer identifies a second memory location containing a last portion of the first M-bit set of data. Provided as the first M-bit set of data are each of the N-bit memory locations between and including the memory location identified by the first read pointer and the memory location identified by the second read pointer.

BRIEF DESCRIPTION OF THE DRAWINGS

FIG. 1 is a block diagram illustrating a data conversion circuit in accordance with the present invention used to convert a byte-wide data stream into a word-wide data stream for storage in memory.

FIG. 2 is a block diagram illustrating one preferred embodiment of the data conversion circuit of the present invention.

FIG. 3 is a diagrammatic illustration of a FIFO memory device used in the data conversion circuit illustrated in FIG. 2, and providing converted sets of data according to a first method.

FIG. 4 is a diagrammatic illustration of a FIFO memory device used in the data conversion circuit illustrated in FIG. 2, and providing converted sets of data according to a second method.

FIG. 5 is a schematic diagram illustrating one possible implementation of the data conversion circuit illustrated in FIG. 2.

DETAILED DESCRIPTION OF THE PREFERRED EMBODIMENTS

FIG. 1 is a block diagram illustrating a system utilizing data conversion circuitry in accordance with the present invention. System 10 includes HDLC core circuitry 12 which receives data on data line 14 and provides in response a byte-wide data stream 102. Under the control or influence of DMA device 16 via connection 18, data conversion circuitry 100 converts byte-wide data stream 102 into word-wide (32 bit) data stream 104 to be provided via data bus 20 to memory device 22 for storage. As discussed in greater detail with reference to FIGS. 2–5, data conversion circuitry 100 includes FIFO memory device 106 and associated circuitry.

Data conversion circuitry 100 is adapted to convert data stream 102 at a first clock rate into data stream 104 at a second clock rate. While data conversion circuitry 100 is illustrated in a particular system 10, circuitry 100 is not limited to this particular application. Further, while data streams 102 and 104 are illustrated as being 8-bits and 32-bits, respectively, circuit 100 is not limited to this particular embodiment. In general, circuit 100 converts N-bit data stream 102 into M-bit data stream 104, where M is preferably an integer multiple of N.

FIG. 2 illustrates in greater detail data conversion circuit 100 in accordance with a preferred embodiment of the present invention. Data conversion circuit 100 is adapted to convert N-bit receive data stream 102 into M-bit data stream 104. Assuming that the throughput of the system bus (for example bus 20 shown in FIG. 1) is adequate, data conversion circuit 100 insures that the system will have sufficient time to retrieve the converted data in order to prevent data loss.

Data conversion circuit 100 includes FIFO memory device 106, output circuitry 108, write pointer generator and enable control circuitry 110 and read circuitry 112. Read circuitry 112 includes first read pointer generator 114, second read pointer generator 116 and control circuitry 118.

FIFO memory device 106 is a memory device having multiple N-bit memory locations (for example N-bit memory locations 160, 162, 164, 166, 168, 170, 172 and 174 illustrated in FIGS. 3 and 4). In a preferred embodiment, each N-bit memory location in FIFO memory device 106 is an N-bit flip flop device (a "flop") FIFO memory device 106 is illustrated and discussed in greater detail with reference to FIGS. 2–5. FIFO memory device 106 receives as an input consecutive N-bit sets of data from N-bit data stream 102, and is adapted to store each consecutively received N-bit set of data in consecutive ones of the multiple N-bit memory locations.

Write pointer generator and enable control circuit 110 is coupled to FIFO memory device 106 via connections 120 and generates information identifying a next available of the multiple N-bit memory locations of FIFO memory 106 at which a next N-bit set of data is to be stored. In one preferred embodiment, write pointer generator and enable control circuit 110 includes a first counter. In this embodiment, the write information or pointer 150 (shown in FIGS. 3 and 4) includes an output count of the first counter. As each N-bit set of data is received and stored in the next available FIFO memory location as identified by the first counter, the first counter output count is incremented or decremented. In embodiments in which FIFO memory device 106 is an array of N-bit flops, circuit 110 generates an enable signal enabling (via connections 120) only the flop corresponding to the next available memory location.

First read pointer generator 114 of read circuitry 112 is coupled to FIFO memory device 106 via connections 122, to output circuitry 108 via connections 126, and to control circuitry 118 via connections 130. First read pointer generator 114 generates information (i.e., generates pointer 152 illustrated in FIGS. 3 and 4) identifying a first of the multiple N-bit memory locations containing a first portion of a first M-bit set of data in the M-bit data stream. Second read pointer generator 116 of read circuitry 112 is coupled to FIFO memory device 106 via connections 124, to output circuitry 108 via connections 128, and to control circuitry 118 via connections 132. Second read pointer generator 116 generates information (i.e., generates pointer 154 illustrated in FIGS. 3 and 4) identifying a second of the N-bit memory locations of FIFO memory device 106 containing a last portion of the first M-bit set of data in the M-bit data stream.

FIFO memory device 106 provides as an output, via output circuitry 108 in preferred embodiments, the first M-bit set of data in the M-bit data stream. Preferably, output circuitry 108 includes multiplexing circuitry which receives the first and second read pointers 152 and 154 via connections 126 and 128, respectively. In response, output circuitry 108 accesses (or multiplexes through) particular N-bit memory locations in FIFO memory device 106 so that the first M-bit set of data in the M-bit data stream 104 includes each of the N-bit memory locations between and including the first N-bit memory location identified by first read pointer generator 114 (pointed to by read pointer 152) and the second N-bit memory location identified by second read pointer generator 116 (pointed to by read pointer 154).

In a preferred embodiment, first and second read pointer generators 114 and 116 include second and third counters, respectively. In this embodiment, the pointer 152 identifying the first N-bit memory location containing the first portion of the first M-bit set of data includes an output count of the second counter.

The pointer 154 identifying the second N-bit memory location containing the last portion of the first M-bit set of data includes an output count of the third counter.

Control circuitry 118 is coupled to FIFO memory device 106 via connections 134, to first read pointer generator 114 via connections 130, to second read pointer generator 116 via connections 132, and to output circuitry 108 via connections 140. Upon the occurrence of a predetermined condition, control circuitry 118 generates a request via connections 136 for the first M-bit set of data to be read from FIFO memory device 106. By way of the example illustrated in FIG. 1, control circuitry 118 can generate a request to the DMA device 16 for the first M-bit set of data to be read on bus 20. If control circuitry 118 receives an acknowledge signal from the host system via connections 138, control circuitry 118 enables output circuitry 108 to pass through to output 109 the data, stored in the memory locations of FIFO 106, corresponding to the first set of M-bit data in the M-bit data stream. At this point, the respective counts of first read pointer generator 114 and second read pointer generator 116 can be adjusted accordingly for use in identifying the memory locations containing the next M-bit set of data.

In a first embodiment illustrated in FIG. 3, the predetermined condition which results in control circuitry 118 generating a request includes the count of the third read counter identifying an N-bit memory location having an end of file indicator stored therein. For example, as illustrated in FIG. 3, write pointer 150 identifies N-bit memory location 172 of FIFO memory device 106 as the next memory location to be written to. First read pointer 152 identifies N-bit memory location 162 as containing a first portion of the next M-bit set of data to be read. Second read pointer 166 identifies N-bit memory location 166 as containing the last portion of the next M-bit set of data to be read by virtue of its containing data having an EOF designation. After an acknowledgement to the request generated by control circuitry 118 is received, data contained in memory locations 162, 164 and 166 will be provided as the next M-bit set of data in data stream 104. If the total number of bits in these memory locations is less than M-bits, the remaining bits can be padded accordingly.

In a second embodiment illustrated in FIG. 3, the predetermined condition which results in control circuitry 118 generating a request includes the counts of the second and third counters obtaining values which are indicative of a predetermined number of N-bit memory locations being included in the first M-bit set of data. In the example illustrated in FIG. 4, with first read pointer 152 identifying memory location 162 and second read pointer 154 identifying memory location 168, a request is generated when read pointer 154 points to a memory location which is three ahead of the memory location pointed to by first read pointer 152. In this example, data contained in memory locations 162, 164 166 and 168 will be provided as the next M-bit set of data in data stream 104.

FIG. 5 is a schematic illustration of a more particular embodiment of the present invention. As illustrated in FIG. 5, FIFO memory device 106 includes multiple N-bit flops 205 each coupled to N-bit data stream 102, and clocked via clock inputs 210 by the receive data clock 106 used to produce N-bit data stream 102. Circuitry 110 enables, via enable inputs 215, only the particular N-bit flop 205 identified by the write pointer. At the rate at which data read requests are acknowledged (e.g., at a clock rate of a host system receiving the M-bit data stream), read circuitry 112 controls multiplexing circuitry 220 to provide the next M-bit set of data.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. A data conversion circuit for converting an N-bit data stream to an M-bit data stream, the data conversion circuit comprising:

a first-in-first-out (FIFO) memory device having a plurality of N-bit memory locations and receiving as an input consecutive N-bit sets of data from the N-bit data stream, wherein the FIFO memory device is adapted to store each consecutively received N-bit set of data in consecutive ones of the plurality of N-bit memory locations;

a write pointer generator generating information identifying a next available of the plurality of N-bit memory locations at which a next N-bit set of data is to be stored;

a first read pointer generator generating information identifying a first of the plurality of N-bit memory locations containing a first portion of a first M-bit set of data in the M-bit data stream; and a second read pointer generator generating information identifying a second of the plurality of N-bit memory locations containing a last portion of the first M-bit set of data in the M-bit data stream, wherein the FIFO memory device provides as an output the first M-bit set of data in the M-bit data stream, and wherein the first M-bit set of data in the M-bit data stream includes each of the plurality of N-bit memory locations between and including the first of the plurality of N-bit memory locations identified by the first read pointer generator and the second of the plurality of N-bit memory locations identified by the second read pointer generator.

2. The data conversion circuit of claim 1, wherein the FIFO memory device is adapted to receive the N-bit data stream at a first clock rate and to provide the M-bit data stream at a second clock rate different than the first clock rate.

3. The data conversion circuit of claim 1, wherein the write pointer generator comprises a first counter, the information identifying the next available of the plurality of N-bit memory location s at which the next N-bit set of data is to be stored includes an output count of the first counter, the first counter output count being incremented upon storage of the next N-bit set of data.

4. The data conversion circuit of claim 3, wherein the first and second read pointer generators comprise second and third counters, respectively, wherein the information identifying the first of the plurality of N-bit memory locations containing the first portion of the first M-bit set of data in the M-bit data stream includes an output count of the second counter, wherein the information identifying the second of the plurality of N-bit memory locations containing the last portion of the first M-bit set of data in the M-bit data stream includes an output count of the third counter.

5. The data conversion circuitry of claim 4, and further comprising request generating circuitry adapted to generate a request for the first M-bit set of data to be read from the FIFO memory device upon the occurrence of a predetermined condition.

6. The data conversion circuit of claim 5, wherein the predetermined condition includes the counts of the second and third counters obtaining values which are indicative of a predetermined number of N-bit memory locations being included in the first M-bit set of data.

7. The data conversion circuit of claim 5, wherein the predetermined condition includes the count of the third read counter identifying an N-bit memory location having an end of file indicator stored therein.

8. The data conversion circuit of claim 7, and further comprising output circuitry coupled to the FIFO memory device, wherein the FIFO memory device provides the first M-bit set of data in the M-bit data stream through the output circuitry.

9. The data conversion circuit of claim 8, wherein the output circuitry comprises multiplexing circuitry coupled to the FIFO memory device, the FIFO memory device providing the first M-bit set of data in the M-bit data stream through the multiplexing circuitry, the first and second read pointer generators being coupled to the multiplexing circuitry such that the information generated by the first read pointer generator and the information generated by the second read pointer generator control which of the plurality of N-bit memory locations are multiplexed to the output of the multiplexing circuitry.

10. The data conversion circuit of claim 9, wherein the FIFO memory device comprises a plurality of N-bit flip flop devices, each of the plurality of N-bit memory locations being provided by one of the plurality of N-bit flip flop devices.

11. A data conversion system for converting an N-bit data stream to an M-bit data stream, the data conversion system comprising:

memory means for receiving consecutive N-bit sets of data from the N-bit data stream and for storing each consecutively received N-bit set of data in one of a plurality of memory locations;

first memory location determining means for determining a next available of the plurality of memory locations at which a next N-bit set of data is to be stored; and second memory location determining means for determining which of the plurality of memory locations contains N-bit sets of data corresponding to a first M-bit set of data in the M-bit data stream, wherein the memory means comprises a first-in-first-out (FIFO) memory device having a plurality of N-bit memory locations and receiving as an input consecutive N-bit sets of data from the N-bit data stream, wherein the FIFO memory device is adapted to store each consecutively received N-bit set of data in consecutive ones of the plurality of N-bit memory locations.

12. The data conversion system of claim 11, wherein the first memory location determining means comprises a write pointer generator generating information identifying a next available of the plurality of N-bit memory locations at which a next N-bit set of data is to be stored.

13. The data conversion system of claim 12, wherein the second memory location determining means comprises:

a first read pointer generator generating information identifying a first of the plurality of N-bit memory locations containing a first portion of the first M-bit set of data in the M-bit data stream; and a second read pointer generator generating information identifying a second of the plurality of N-bit memory locations containing a last portion of the first M-bit set of data in the M-bit data stream, wherein the first M-bit set of data in the M-bit data stream includes N-bit sets of data stored in each of the plurality of N-bit memory locations between and including the first of the plurality of N-bit memory locations identified by the first read pointer generator and the second of the plurality of N-bit memory locations identified by the second read pointer generator.

14. The data conversion system of claim 13, and further comprising request generating means for generating a request for the first M-bit set of data to be read from the FIFO memory device when the information generated by the first and second read pointer generators is indicative of a predetermined number of N-bit memory locations being included in the first M-bit set of data.

15. The data conversion system of claim 13, and further comprising request generating means for generating a request for the first M-bit set of data to be read from the FIFO memory device when the second of the plurality of N-bit memory locations has an end of file indicator stored therein.

16. The data conversion system of claim 13, and further comprising output circuitry coupled to the FIFO memory device, wherein the FIFO memory device provides the first M-bit set of data in the M-bit data stream through the output circuitry.

17. A method of converting an N-bit data stream to an M-bit data stream, the method comprising:

receiving a plurality of consecutive N-bit sets of data in the N-bit data stream;

storing each of the received N-bit sets of data in one of a plurality of N-bit memory locations of a first-in-first-out (FIFO) memory, wherein after a first of the received N-bit sets of data is stored in a first memory location identified by a write pointer generator the write pointer generator identifies a second memory location for storage of a next N-bit set of data; and upon the occurrence of a predetermined condition, providing as a first M-bit set of data in the M-bit data stream N-bit sets of data stored in FIFO memory locations between a third memory location identified by a first read pointer generator and a fourth memory location identified by a second read pointer generator.

18. The method of claim 17, wherein the predetermined condition includes the information generated by the first and second read pointer generators being indicative of a predetermined number of N-bit memory locations being included in the first M-bit set of data.

19. The method of claim 17, wherein the predetermined condition includes the fourth memory location having an end of file indicator stored therein.

\* \* \* \* \*